(12) United States Patent
Sun

(10) Patent No.: US 6,770,551 B2
(45) Date of Patent: Aug. 3, 2004

(54) METHODS FOR MANUFACTURING SEMICONDUCTOR AND CMOS TRANSISTORS

(75) Inventor: Shih Chun Sun, Hsinchu (TW)

(73) Assignee: ProMos Technologies, Inc., Hsinchu (TW)

( * ) Notice: Subject to any disclaimer, the term of this patent is extended or adjusted under 35 U.S.C. 154(b) by 0 days.

(21) Appl. No.: 10/138,104

(22) Filed: May 3, 2002

(65) Prior Publication Data

US 2003/0139038 A1 Jul. 24, 2003

(30) Foreign Application Priority Data

Jan. 23, 2002 (TW) .......................... 91101099 A

(51) Int. Cl.[7] .......................... H01L 21/3205
(52) U.S. Cl. .................. 438/592; 438/655; 438/659
(58) Field of Search .................. 438/658–659, 438/199, 231, 592, 588, 655–656; 257/753, 751, 412–413, 770, 757

(56) References Cited

U.S. PATENT DOCUMENTS

| | | | | | |
|---|---|---|---|---|---|
| 4,782,033 | A | * | 11/1988 | Gierisch et al. | 438/199 |
| 5,134,085 | A | * | 7/1992 | Gilgen et al. | 438/210 |
| 5,234,850 | A | * | 8/1993 | Liao | 438/231 |
| 5,350,698 | A | * | 9/1994 | Huang et al. | 438/305 |
| 5,652,183 | A | * | 7/1997 | Fujii | 438/621 |
| 5,705,845 | A | * | 1/1998 | Fujii | 257/412 |
| 5,796,166 | A | * | 8/1998 | Agnello et al. | 257/751 |
| 5,851,922 | A | * | 12/1998 | Bevk et al. | 438/655 |
| 5,897,349 | A | * | 4/1999 | Agnello | 438/230 |
| 5,940,725 | A | * | 8/1999 | Hunter et al. | 438/592 |
| 5,943,592 | A | * | 8/1999 | Tsukamoto et al. | 438/486 |
| 6,096,630 | A | * | 8/2000 | Byun et al. | 438/592 |
| 6,174,775 | B1 | * | 1/2001 | Liaw | 438/283 |
| 6,204,171 | B1 | * | 3/2001 | Hu | 438/653 |
| 6,406,952 | B2 | * | 6/2002 | Bevk | 438/199 |
| 6,500,740 | B1 | * | 12/2002 | Bevk | 438/532 |
| 6,528,847 | B2 | * | 3/2003 | Liu | 257/330 |
| 6,605,843 | B1 | * | 8/2003 | Krivokapic et al. | 257/347 |
| 2003/0062566 | A1 | * | 4/2003 | Schuegraf et al. | 257/316 |

* cited by examiner

*Primary Examiner*—Long Pham
*Assistant Examiner*—Thao X. Le
(74) *Attorney, Agent, or Firm*—Volpe and Koenig, P.C.

(57) ABSTRACT

A method for manufacturing a semiconductor element is provided. The method includes a first silicon region, a second silicon region, and a metal silicide layer, wherein the metal silicide layer contacts with the first silicon region and the second silicon region separately, the method including steps of performing a first doping process to dope an N-type dopant into the first silicon region and to dope a diffusion barrier impurity into a portion of the metal silicide layer contacting with the first silicon region, and performing a second doping process to dope a P-type dopant into the second silicon region and to dope a diffusion barrier impurity into a portion of the metal silicide layer contacting with the second silicon region.

25 Claims, 3 Drawing Sheets

METHODS FOR MANUFACTURING SEMICONDUCTOR AND CMOS TRANSISTORS

FIELD OF THE INVENTION

This invention relates to a semiconductor element, and more particularly to a method for manufacturing a CMOS (Complementary Metal-Oxide-Semiconductor) transistor.

BACKGROUND OF THE INVENTION

MOS (Metal-Oxide-Semiconductor) transistors are the most important basic units in nowadays manufacturing process of a semiconductor. Because of the different kind of carriers, there are two kinds of essential structure for MOS transistors such as P-type MOS transistor and N-type transistor. Generally speaking, under the consideration of the speed of the elements, the N-type MOS transistor which utilizes the electron as the carrier is most common used. But for considering the "low energy consumption", a manufacturing process of CMOS transistor in which the P-type and N-type MOS transistors are simultaneously formed thereon is produced. Please refer to FIG. 1. FIG. 1 shows the schematical view of the known manufacturing process of a CMOS transistor gate structure. As shown in FIG. 1, after a silicon oxide insulator 11 is formed on the silicon substrate 10, a polysilicon layer 12 and a metal silicide layer 13 (generally a tungsten silicide, $WSi_x$) are sequentially formed on the silicon oxide insulator 11 to constitute an undefined pattern of the gate structure layers. However, the polysilicon layer 12 in the region of N-type MOS transistor has to dope a pentad such as phosphorous. Also, the polysilicon layer 12 in the region of P-type MOS transistor has to dope trivalent element, e.g., boron.

Nevertheless, the manufacturing process described above has a significant deficiency. The deficiency is that two kinds of dopants will diffuse from the polysilicon layer 12 outwardly to the metal silicide layer 13 and reciprocally diffuse along the grain boundary of the metal silicide layer 13 to another region of the polysilicon layer 12 (the arrow as shown in FIG. 1). This situation will cause the variation of the predicted doping concentration, moreover shift the predicted threshold voltage (VT) of the element, and influence the stability of product quality seriously. For solving this deficiency, U.S. Pat. No. 5,652,183 provides a solving method. This method is about directly depositing a silicon rich metal silicide layer (a silicon rich tungsten silicide, Si rich $WSi_x$, 2.36<x<4) for substituting the metal silicide layer 13 described above. Therefore, the route of the dopant which reciprocally diffuses along the grain boundary is blocked by doping the redundant silicon atoms into the grain boundary of the metal silicide layer 13. Consequently, the deficiency of producing the shift of the threshold voltage is improved. But the high resistance of the silicon rich tungsten silicide will cause the problem of imperfect interconnect in the sequential accomplished gate structure.

SUMMARY OF THE INVENTION

It is an object of the present invention to provide a method for manufacturing a CMOS transistor in the semiconductor manufacturing process.

It is another object of the present invention to provide a method to avoid the situation of the reciprocal diffusion along the grain boundary of the dopants in the semiconductor manufacturing process.

It is another further object of the present invention to improve the problem of high resistance of silicon rich tungsten silicide which causes the imperfect interconnect in the gate structure.

According to an aspect of the present invention, the method for manufacturing a semiconductor element includes a first silicon region, a second silicon region, and a metal silicide layer, wherein the metal silicide layer contacts with the first silicon region and the second silicon region separately, the method including steps of performing a first doping process to dope an N-type dopant into the first silicon region and to dope a diffusion barrier impurity into a portion of the metal silicide layer contacting with the first silicon region, and performing a second doping process to dope a P-type dopant into the second silicon region and to dope a diffusion barrier impurity into a portion of the metal silicide layer contacting with the second silicon region.

Preferably, the semiconductor element is a CMOS transistor.

Preferably, the first silicon region and the second silicon region are originally made of undoped polysilicon.

Preferably, the metal silicide layer is a tungsten silicide layer.

Preferably, the metal silicide layer separately covers on the first silicon region and the second silicon region.

Preferably, the first doping process includes steps of performing a first photolithography process for defining a first masking layer on the metal silicide layer, doping the N-type dopant and the diffusion barrier impurity respectively into a portion of the metal silicide layer which is not covered by the first masking layer, and the first silicon region formed thereunder, and removing the first masking layer.

Preferably, the second doping process includes steps of performing a second photolithography process for defining a second masking layer on the metal silicide layer, doping the P-type dopant and the diffusion barrier impurity respectively into a portion of the metal silicide layer which is not covered by the second masking layer, and the second silicon region formed thereunder, and removing the second masking layer.

Preferably, the first masking layer, the second masking layer, and the metal silicide layer further include a silicon nitride layer thereamong, and the first silicon region and the second silicon region further include a silicon oxide layer and a silicon substrate thereunder.

Preferably, the masking layers, the N-type dopant, the P-type dopant, and the diffusion barrier impurity respectively are photoresists, phosphorous dopants, boron dopants, and silicon dopants, the first silicon region and the second silicon region are originally made of undoped polysilicon, and the metal silicide layer is a tungsten silicide layer.

Preferably, the silicon oxide layer, the undoped polysilicon layer, the tungsten silicide layer, and the silicon nitride layer respectively have thicknesses within a range of 20 to 60 angstroms, 1500 to 2000 angstroms, 500 to 650 angstroms, and 1100 to 1300 angstroms.

Preferably, the phosphorous dopants are doped at a quantity within a range of $4 \times 10^{15}$ to $6 \times 10^{15}$ atoms/cm$^2$ and at an applied energy within a range of 180 to 230 kiloeletrons voltage, the boron dopants are doped at a quantity within a range of $1 \times 10^{15}$ to $2 \times 10^{15}$ atoms/cm$^2$ and at an applied energy within a range of 70 to 90 kiloeletrons voltage, and the silicon dopants are doped at a quantity within a range of $1 \times 10^{14}$ to $1 \times 10^{15}$ atoms/cm$^2$ and at an applied energy within a range of 140 to 160 kiloelectrons voltage.

Preferably, the tungsten silicide layer having a ratio of silicon atoms and tungsten atoms is within a range of 2.6 to 3.0 after a portion of the tungsten silicide layer is doped by silicon dopants.

Preferably, the method further includes a step of performing a third photolithography process after the second doping process for defining a plural of gate structures on the first silicon region, the second silicon region, and the metal silicide layer.

Preferably, the second doping process is sequentially performed after the first doping process is completed.

Preferably, the first doping process is sequentially performed after the second doping process is completed.

In accordance with an aspect of the present invention, a method for manufacturing a CMOS transistor includes steps of providing a silicon substrate, forming a silicon oxide layer on the silicon substrate, forming a first silicon region and a second silicon region on the silicon oxide layer, forming a metal silicide layer on the first silicon region and the second silicon region, forming a cap layer on the metal silicide layer, performing a first doping process to dope an N-type dopants into the first silicon region and a diffusion barrier impurity into a portion of the metal silicide layer which contacts with the first silicon region, performing a second doping process to dope a P-type dopant into the second silicon region and a diffusion barrier impurity into a portion of the metal silicide layer which contacts with the second silicon region, and performing a third photolithography process for defining a plural of gate structures on the silicon oxide layer, the first silicon region, the second silicon region, the metal silicide layer, and the cap layer.

Preferably, the first silicon region and the second silicon region are originally made of undoped polysilicon, the metal silicide layer is a tungsten silicide layer, and the covering layer is a silicon nitride layer.

Preferably, the first dope embedding process includes steps of performing a first photolithography process for defining a first masking layer on the metal silicide layer, doping the N-type dopant and the diffusion barrier impurity respectively into a portion of the metal silicide layer which is not covered by the first masking layer, and the first silicon region formed thereunder, and removing the first masking layer.

Preferably, the second doping process includes steps of performing a second photolithography process for defining a second masking layer on the metal silicide layer, doping the P-type dopant and the diffusion barrier impurity respectively into a portion of the metal silicide layer which is not covered by the second masking layer, and the second silicon region formed thereunder, and removing the second masking layer.

Preferably, the masking layers, the N-type dopant, the P-type dopant, and the diffusion barrier impurity respectively are photoresists, phosphorous dopants, boron dopants, and silicon dopants, the first silicon region and the second silicon region are originally made of undoped polysilicon, and the metal silicide layer is a tungsten silicide layer.

Preferably, the silicon oxide layer, the undoped polysilicon layer, the tungsten silicide layer, and the silicon nitride layer respectively have thicknesses within a range of 20 to 60 angstroms, 1500 to 2000 angstroms, 500 to 650 angstroms, and 1100 to 1300 angstroms.

Preferably, the phosphorous dopants are doped at a quantity within a range of $4\times10^{15}$ to $6\times10^{15}$ atoms/cm$^2$ and at an applied energy within a range of 180 to 230 kiloeletrons voltage, the boron dopants are doped at a quantity within a range of $1\times10^{15}$ to $2\times10^{15}$ atoms/cm$^2$ and at an applied energy within a range of 70 to 90 kiloeletrons voltage, and the silicon dopants are doped at a quantity within a range of $1\times10^{14}$ to $1\times10^{15}$ atoms/cm$^2$ and at an applied energy within a range of 140 to 160 kiloelectrons voltage.

Preferably, the tungsten silicide layer having a ratio of silicon atoms to tungsten atoms within a range of 2.6 to 3.0 after a portion of the tungsten silicide layer is doped by silicon dopants.

Preferably, the second doping process is sequentially performed after the first doping process is completed.

Preferably, the first doping process is sequentially performed after the second doping process is completed.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

Figure 1:
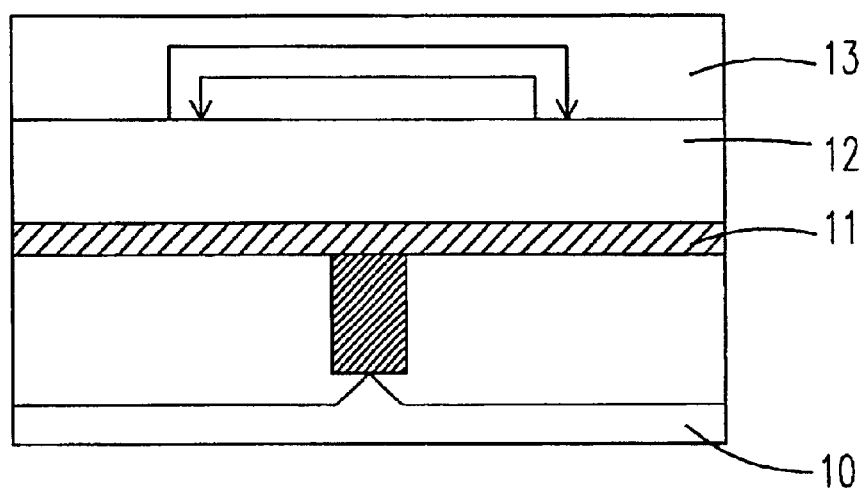
FIG. 1 is a schematical view showing the known manufacturing process of a CMOS transistor structure.
Figure 2A:
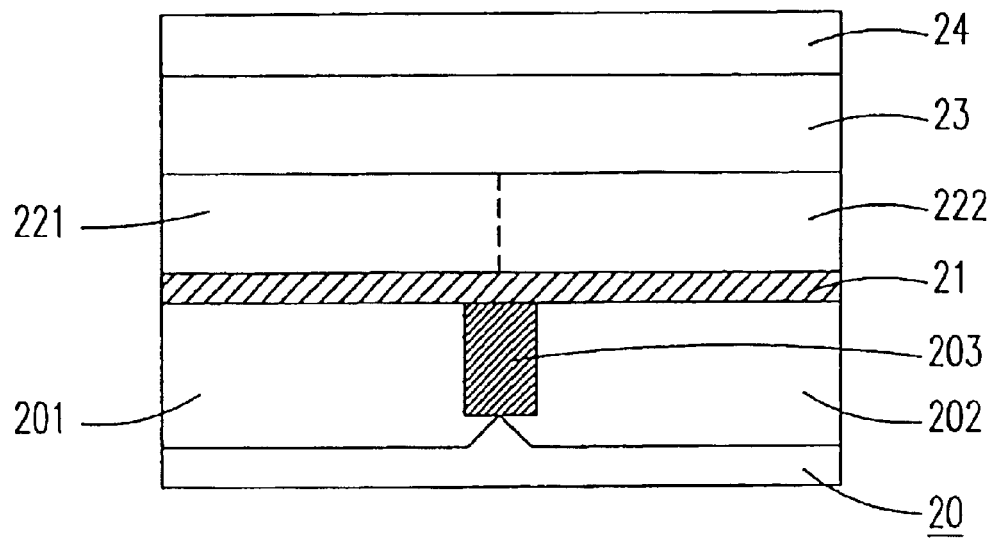
FIGS. 2A~2D are schematical views showing the manufacturing process of a preferred embodiment of the CMOS transistor according to the present invention.
Figure 2B:
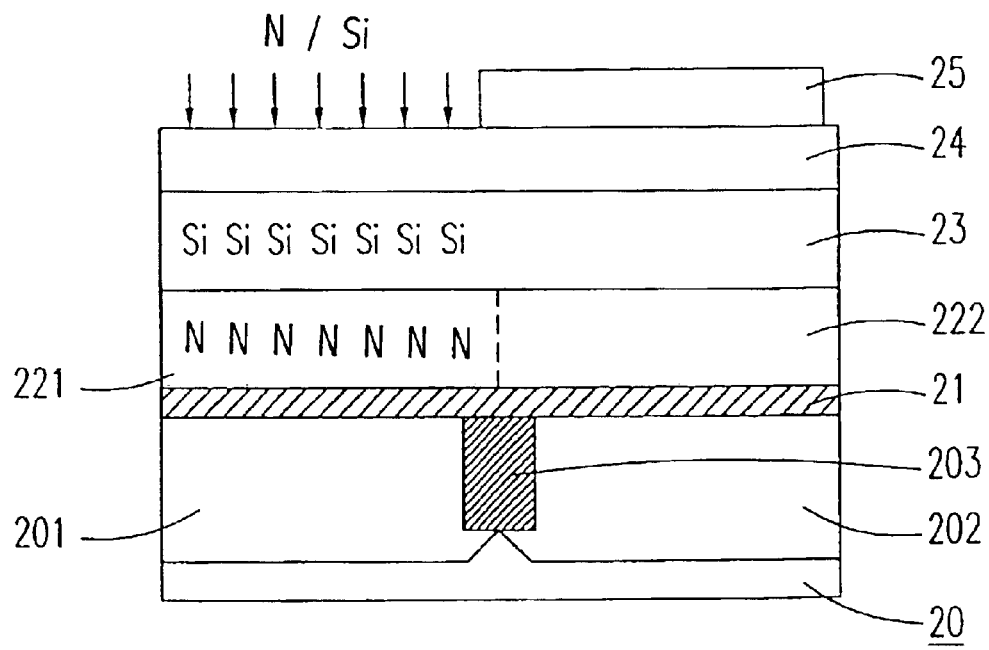
Figure 2C:
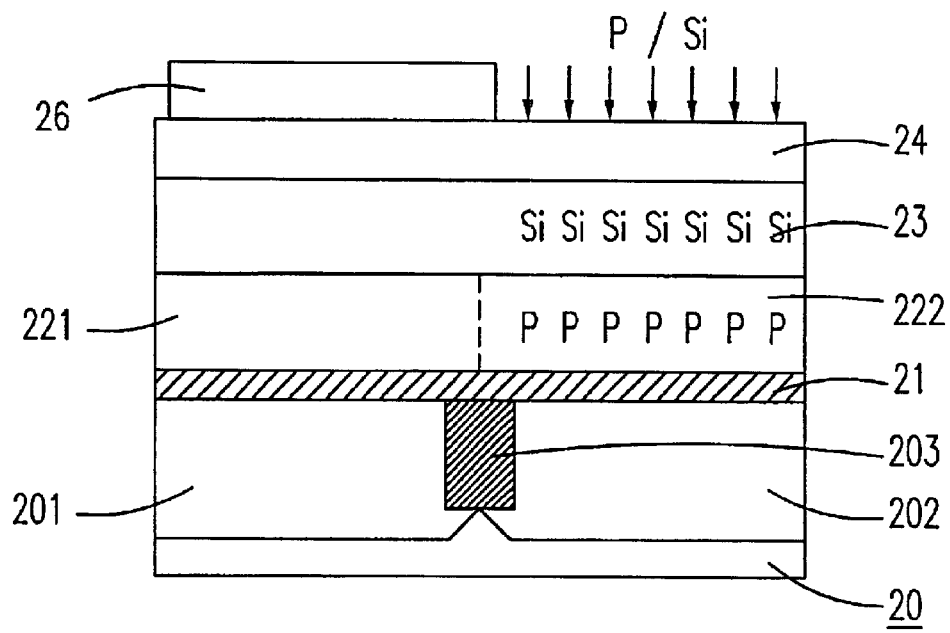
Figure 2D:
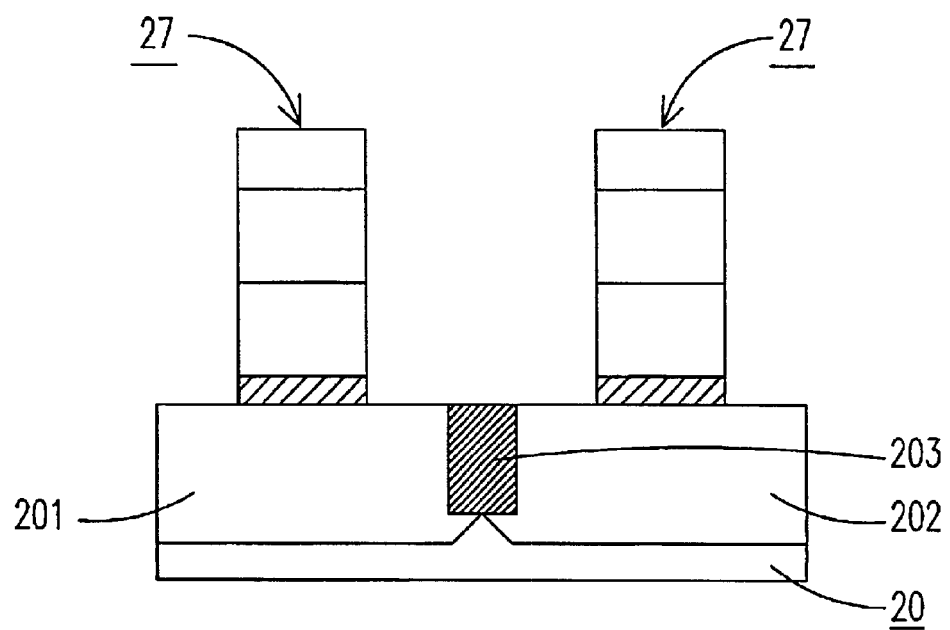

Please refer to FIGS. 2A–2D. FIGS. 2A~2D schematically show the manufacturing process of a preferred embodiment of the CMOS transistor according to the present invention. FIG. 2A shows the steps of forming the silicon oxide layer 21, the first silicon are 221 and the second silicon region 222, the metal silicide layer 23, and the cap layer 24 on the silicon substrate 20 having the P well 201, the N well 202, and the separating plate 203. Sequentially, FIG. 2B describes the following steps: performing the first photolithography and doping processes on the cap layer 24 to define a first masking layer 25; then, doping the N-type dopant and the diffusion barrier impurity respectively into a portion of the metal silicide layer 23 which is not covered by the first masking layer 25, and the first silicon region 221 formed thereunder; and finally, removing the first masking layer 25. FIG. 2C shows the following steps: defining a second masking layer 26 on the cap layer 24 by the second photolithography and doping processes; then, doping the P-type dopant and the diffusion barrier impurity respectively into a portion of the metal silicide layer 23 which is not covered by the second masking layer 26, and the second silicon region 222 formed thereunder; finally, removing the second masking layer 26. Finally, FIG. 2D describes the following step: performing the third photolithography on the silicon oxide layer 21, the first silicon region 221 and the second silicon region 222, the metal silicide layer 23, and the cap layer 24 to define a plurality of gate structure 27.

The masking layers 25 and 26, the N-type dopant, the P-type dopant, and the diffusion barrier impurity are photoresists, phosphorous dopants, boron dopants, and silicon dopants separately. The original materials of the first silicon region and the second silicon region are undoped polysilicon. The metal silicide layer is a tungsten silicide layer, and the cap layer is a silicon nitride layer. The thicknesses of the silicon oxide layer, the undoped polysilicon, the tungsten suicide layer, and the silicon nitride layer are ranged from 20 to 60 angstroms, from 1500 to 200 angstroms, from 500 to 650 angstroms, and from 1100 to 1300 angstroms.

In addition, in the doping process, the phosphorous dopants are doped at a quantity ranged from $4\times10^{15}$ to $6\times10^{15}$ atoms/cm$^2$ and at an applied energy ranged from 180 to 230 kiloeletrons voltage, the boron dopants are doped at a quantity ranged from $1\times10^{15}$ to $2\times10^{15}$ atoms/cm$^2$ and at an applied energy ranged from 70 to 90 kiloeletrons voltage, and the silicon dopants are doped at a quantity ranged from $1\times10^{14}$ to $1\times10^{15}$ atoms/cm$^2$ and at an applied energy ranged from 140 to 160 kiloelectrons voltage. The ratio of silicon and tungsten atoms in the tungsten silicide layer is ranged from 2.6 to 3.0 after a portion of the tungsten silicide layer is doped by silicon dopants.

As described above, the present invention selectively dopes redundant silicon atoms into the element region of the metal silicide layer 23 to break the route of the dopant which reciprocally diffuses along the grain boundary. Consequently, the deficiency of producing the shift of the threshold voltage is improved. Furthermore, because the other region of the metal silicide layer 23 which is used as the gate interconnect is redundant silicon atoms free, the gate interconnect can still maintained low sheet resistance. Hence, the known deficiency in the prior art is effectively improved, and the main purpose of the present invention is also achieved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a semiconductor element including a first silicon region, a second silicon region, and a metal silicide layer having lower and upper sides, wherein said lower side of said metal silicide layer contacts with said first silicon region and said second silicon region separately, and said upper side of said metal silicide layer provides for a gate interconnect, said method comprising steps of:
   performing a first doping process to dope an N-type dopant into said first silicon region and to dope a silicon as a diffusion barrier impurity into a portion of said metal silicide layer at said lower side thereof contacting with said first silicon region; and
   performing a second doping process to dope a P-type dopant into said second silicon region and to dope a silicon as a diffusion barrier impurity into a portion of said metal silicide layer at said lower side contacting with said second silicon region.

2. The method according to claim 1 wherein said semiconductor element is a CMOS (Complementary Metal-Oxide-Semiconductor) transistor.

3. The method according to claim 1 wherein said first silicon region and said second silicon region are originally made of undoped polysilicon.

4. The method according to claim 1 wherein said metal silicide layer is a tungsten silicide layer.

5. The method according to claim 1 wherein said metal silicide layer separately covers on said first silicon region and said second silicon region.

6. The method according to claim 1 wherein said first doping process comprises steps of:

performing a first photolithography process for defining a first masking layer on said metal silicide layer;
   doping said N-type dopant and said diffusion barrier impurity respectively into a portion of said metal silicide layer which is not covered by said first masking layer, and said first silicon region formed thereunder; and
   removing said first masking layer.

7. The method according to claim 6 wherein said second doping process comprises steps of:
   performing a second photolithography process for defining a second masking layer on said metal silicide layer;
   doping said P-type dopant and said diffusion barrier impurity respectively into a portion of said metal silicide layer which is not covered by said second masking layer, and said second silicon region formed thereunder; and
   removing said second masking layer.

8. The method according to claim 7 wherein said first masking layer, said second masking layer, and said metal silicide layer further comprise a silicon nitride layer thereamong, and said first silicon region and said second silicon region further comprise a silicon oxide layer and a silicon substrate thereunder.

9. The method according to claim 8 wherein said masking layers, said N-type dopant, and said P-type dopant, respectively, are photoresists, phosphorous dopants, and boron dopants, said first silicon region and said second silicon region are originally made of undoped polysilicon, and said metal silicide layer is a tungsten silicide layer.

10. The method according to claim 9 wherein said silicon oxide layer, said undoped polysilicon layer, said tungsten silicide layer, and said silicon nitride layer respectively have thicknesses within a range of 20 to 60 angstroms, 1500 to 2000 angstroms, 500 to 650 angstroms, and 1100 to 1300 angstroms.

11. The method according to claim 9 wherein said phosphorous dopants are doped at a quantity within a range of $4\times10^{15}$ to $6\times10^{15}$ atoms/cm$^2$ and at an applied energy within a range of 180 to 230 kiloeletrons voltage, said boron dopants are doped at a quantity within a range of $1\times10^{15}$ to $2\times10^{15}$ atoms/cm$^2$ and at an applied energy within a range of 70 to 90 kiloeletrons voltage, and said silicon dopants are doped at a quantity within a range of $1\times10^{14}$ to $1\times10^{15}$ atoms/cm$^2$ and at an applied energy within a range of 140 to 160 kiloelectrons voltage.

12. The method according to claim 9 wherein said tungsten silicide layer having a ratio of silicon atoms to tungsten atoms within a range of 2.6 to 3.0 after a portion of said tungsten silicide layer is doped by silicon dopants.

13. The method according to claim 1 further comprising a step of performing a photolithography process after said second doping process for defining a plural of gate structures on said first silicon region, said second silicon region, and said metal silicide layer.

14. The method according to claim 1 wherein said second doping process is sequentially performed after said first doping process is completed.

15. The method according to claim 1 wherein said first doping process is sequentially performed after said second doping process is completed.

16. A method for manufacturing a CMOS (Complementary Metal-Oxide-Semiconductor) transistor, comprising steps of:
   providing a silicon substrate;
   forming a silicon oxide layer on said silicon substrate;

forming a first silicon region and a second silicon region on said silicon oxide layer;

forming a metal silicide layer on said first silicon region and said second silicon region, said metal silicide layer having lower and upper sides, wherein said lower side of said metal silicide layer contacts with said first silicon region and said second silicon region separately, and said side of said metal silicide layer provides for a gate interconnect;

forming a cap layer on said metal silicide layer;

performing a first doping process to dope an N-type dopants into said first silicon region and a silicon as a diffusion barrier impurity into a portion of said metal silicide layer at said lower side thereof which contacts with said first silicon region;

performing a second doping process to dope a P-type dopant into said second silicon region and a silicon as a diffusion barrier impurity into a portion of said metal silicide layer at said lower side thereof which contacts with said second silicon region; and performing a photolithography process for defining a plural of gate structures on said silicon oxide layer, said first silicon region, said second silicon region, said metal silicide layer, and said cap layer.

17. The method according to claim 16 wherein said first silicon region and said second silicon region are originally made of undoped polysilicon, said metal silicide layer is a tungsten silicide layer, and said cap layer is a silicon nitride layer.

18. The method according to claim 16 wherein said first dope embedding process comprises steps of:

performing a first photolithography process for defining a first masking layer on said metal silicide layer;

doping said N-type dopant and said diffusion barrier impurity respectively into a portion of said metal silicide layer which is not covered by said first masking layer, and said first silicon region formed thereunder; and removing said first masking layer.

19. The method according to claim 16 wherein said second doping process comprises steps of:

performing a second photolithography process for defining a second masking layer on said metal silicide layer;

doping said P-type dopant and said diffusion barrier impurity respectively into a portion of said metal silicide layer which is not covered by said second masking layer, and said second silicon region formed thereunder; and removing said second masking layer.

20. The method according to claim 19 wherein said masking layers, said N-type dopant, and said P-type dopant, respectively, are photoresists, phosphorous dopants, and boron dopants, said first silicon region and said second silicon region are originally made of undoped polysilicon, and said metal silicide layer is a tungsten silicide layer.

21. The method according to claim 20 wherein said silicon oxide layer, said undoped polysilicon layer, said tungsten silicide layer, and said silicon nitride layer respectively have thicknesses within a range of 20 to 60 angstroms, 1500 to 2000 angstroms, 500 to 650 angstroms, and 1100 to 1300 angstroms.

22. The method according to claim 20 wherein said phosphorous dopants are doped at a quantity within a range of $4\times10^{15}$ to $6\times10^{15}$ atoms/cm$^2$ and at an applied energy within a range of 180 to 230 kiloeletrons voltage, said boron dopants are doped at a quantity within a range of $1\times10^{15}$ to $2\times10^{15}$ atoms/cm$^2$ and at an applied energy within a range of 70 to 90 kiloeletrons voltage, and said silicon dopants are doped at a quantity within a range of $1\times10^{14}$ to $1\times10^{15}$ atoms/cm$^2$ and at an applied energy within a range of 140 to 160 kiloelectrons voltage.

23. The method according to claim 20 wherein said tungsten silicide layer having a ratio of silicon atoms to tungsten atoms within a range of 2.6 to 3.0 after a portion of said tungsten silicide layer is doped by silicon dopants.

24. The method according to claim 16 wherein said second doping process is sequentially performed after said first doping process is completed.

25. The method according to claim 16 wherein said first doping process is sequentially performed after said second doping process is completed.

* * * * *